US005722158A

United States Patent [19]
Fritz et al.

[11] Patent Number: 5,722,158
[45] Date of Patent: Mar. 3, 1998

[54] METHOD OF MANUFACTURE AND RESULTING THERMOELECTRIC MODULE

[76] Inventors: Robert E. Fritz, 2041 Vista Del Mar, San Mateo, Calif. 94404; Joseph R. Monkowski, 1580 Lawrence Rd., Danville, Calif. 94506

[21] Appl. No.: 778,948

[22] Filed: Jan. 6, 1997

Related U.S. Application Data

[63] Continuation of Ser. No. 476,998, Jun. 7, 1995, abandoned, which is a continuation-in-part of Ser. No. 395,258, Feb. 28, 1995, Pat. No. 5,515,238, which is a continuation of Ser. No. 141,454, Oct. 22, 1993, Pat. No. 5,434,744.

[51] Int. Cl.⁶ ..................................................... H01R 43/00
[52] U.S. Cl. ............................ 29/825; 136/204; 136/205; 437/187; 437/189; 437/903
[58] Field of Search .............................. 29/825; 437/187, 437/189, 903, 8; 136/205, 204; 62/3

[56] References Cited

U.S. PATENT DOCUMENTS

| Re. 30,652 | 6/1981 | Germano . |
|---|---|---|
| 3,399,539 | 9/1968 | Herman . |
| 3,780,425 | 12/1973 | Penn . |
| 4,730,459 | 3/1988 | Schlicklin et al. . |
| 4,755,785 | 7/1988 | Bernstein . |
| 4,855,810 | 8/1989 | Gelb et al. . |
| 4,859,250 | 8/1989 | Buist . |
| 4,902,648 | 2/1990 | Ohta et al. . |
| 4,907,060 | 3/1990 | Nelson et al. . |
| 5,168,339 | 12/1992 | Yokotani et al. . |
| 5,228,923 | 7/1993 | Hed . |
| 5,241,828 | 9/1993 | Kapitulnik . |
| 5,325,268 | 6/1994 | Nachmani et al. . |
| 5,362,983 | 11/1994 | Yamamura et al. . |

FOREIGN PATENT DOCUMENTS

| 1187285 | 2/1965 | Germany . | |
|---|---|---|---|
| 274118 | 12/1989 | Germany . | |
| 1-223781 | 9/1989 | Japan . | |
| 1-256180 | 10/1989 | Japan . | |
| 4-10674 | 1/1992 | Japan . | |
| 1 033 018 | 6/1966 | United Kingdom | 437/903 |
| 1441787 | 7/1976 | United Kingdom | 437/903 |

*Primary Examiner*—Carl J. Arbes
*Attorney, Agent, or Firm*—Townsend and Townsend and Crew

[57] ABSTRACT

A method of manufacturing a thermoelectric module is provided. A first electrically conductive pattern is defined on a first substrate and a second electrically conductive pattern is defined on a second substrate. Alternating bars of a first thermoelectric material and a second thermoelectric material are arranged parallel to each other. The bars are fixed into place on the first conductive pattern by an effective thermal and electrical connection with the conductive pattern. One such connection means is soldering. Then the bars are separated into elements. The second substrate is positioned over the elements and fixed to the elements to complete the manufacture of the TEM.

46 Claims, 9 Drawing Sheets

METHOD OF MANUFACTURE AND RESULTING THERMOELECTRIC MODULE

This is a Continuation of application Ser. No. 08/476,998, filed Jun. 7, 1995, now abandoned, the disclosure of which is incorporated by reference, which is a continuation-in-part of U.S. application Ser. No. 08/395,258, filed Feb. 28, 1995, now U.S. Pat. No. 5,515,238, issued Feb. 28,1995 which is a continuation of U.S. application Ser. No. 08/141/454, filed Oct. 22, 1993, now U.S. Pat. No. 5,439,744 issued Oct. 22, 1993.

BACKGROUND OF THE INVENTION

The present invention is related to solid-state electronic heat pumps, known as thermoelectric modules (TEMs), and to their manufacture. More particularly, the present invention is related to an improved manufacturing method so that TEMs can be manufactured at lower cost. The resulting TEM is also improved and can operate at high performance and efficiency.

A thermoelectric module is typically formed by an electrical circuit of elements of alternating types of thermoelectric materials, which are connected in series. Each thermoelectric material element has two sides, one side connected to a higher voltage than the other side, when the module is in operation. Physically the thermoelectric material elements are arranged so that the hot sides of thermoelectric material elements define one side of the TEM and the cold sides of the elements define the other side of the TEM.

Operationally, as current is driven through the TEM, the electronic carriers in the thermoelectric material elements carry thermal energy from one direction to the other. In other words, the TEM is a heat pump which transfers heat by electric current. There are no moving parts, as in the case of a mechanical heat pump.

Present TEM manufacturing methods require skilled technicians to arrange the thermoelectric material elements during manufacture. To replace this manual assembly, other methods have been attempted, including automation, robots, and mechanical spacing aids, without much success.

Besides high manufacturing costs, a problem with these conventionally manufactured TEMs has been that the operating point of maximum cooling power is substantially different from the operating point of maximum coefficient of performance. That is, at maximum cooling, the TEM does not operate at peak efficiency. The result is that, for a particular application which limits the number of TEMs, a large, expensive power supply is required to drive the TEMs at high power and low efficiency. Alternatively, where the constraint on the number of TEMs is removed, a less expensive power supply can drive an increased number of TEMs at lower power and higher efficiency. Neither alternative is satisfactory. In one case, increased costs go toward the power supply. In the other case, the increased costs go toward the additional TEMs, which occupy more space.

Efforts to overcome this problem appear to be directed toward the development of new thermoelectric materials which have higher maximums in cooling power or coefficient of performance. In contrast, a TEM manufactured with present thermoelectric materials increases its cooling power so that a much greater cooling power according to the present invention is reached around the maximum coefficient of performance. As new thermoelectric materials are developed, a TEM with the improved performance according to the present invention should also be correspondingly improved.

The present invention permits for a superior arrangement of such elements without skilled technicians.

SUMMARY OF THE INVENTION

For such improvement, the present invention provides for a method of manufacturing a thermoelectric module. A first electrically conductive pattern is defined on a first substrate and a second electrically conductive pattern is defined on a second substrate. Alternating bars of a first thermoelectric material and a second thermoelectric material are arranged parallel to each other. The bars are fixed into place on the first conductive pattern by an effective thermal and electrical connection with the conductive pattern. One such connection means is soldering. Then the bars are separated into elements. The second substrate is positioned over the elements and fixed to the elements to complete the manufacture of the TEM.

The result is an improved thermoelectric module which has a first substrate having a surface bearing a first electrically conductive pattern, a second substrate having a surface opposing said first substrate surface and bearing a second electrically conductive pattern, and an array of first and second thermoelectric material elements are arranged between the surfaces of said first and second substrates. Each first and second material element has a first side contacting the first conductive pattern and a second side contacting the second electrically conductive pattern. The first and second conductive patterns are arranged with respect to the array to form one or more electrical circuits of serially connected first and second thermoelectric material elements, with the first and second material elements alternating in the circuit. The array is arranged in alternating rows of first and second thermoelectric material elements, with each element in a row spaced apart from a neighboring element in the row by less than 0.010 inch. Thus more first and second material elements may be placed between the surfaces of the first and second substrates to form an improved thermoelectric module, with a higher cooling power at the maximum coefficient of performance.

DETAILED DESCRIPTION OF PREFERRED EMBODIMENT(S)

Figure 1:
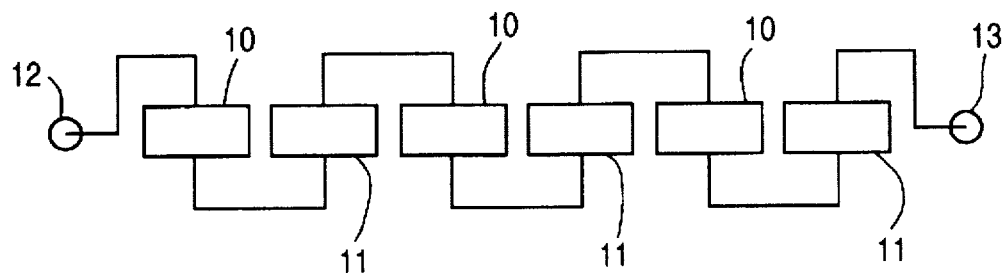
FIG. 1 is a representative circuit of a thermoelectric module (TEM).

FIG. 1 is a representative diagram of the electric circuit of a TEM. A TEM has two terminals 12 and 13, between which are connected several thermoelectric elements 10 and 11. In the TEM the elements 10 and 11 are connected in series alternately. The elements 10 are of one type of thermoelectric material and the elements 11 are of another type. Typically semiconductor material is used where one type is doped with N-type impurities and the other type doped with P-type impurities.

The thermoelectric elements 10 and 11 are arranged in such a manner that the electronic carriers in the elements 10 and 11 work cooperatively with each other to heat or cool one side or the other of a TEM. The structure of a TEM will become apparent below. Present TEM manufacturing methods, which are virtually the same, require skilled manual labor.

Figure 2A:
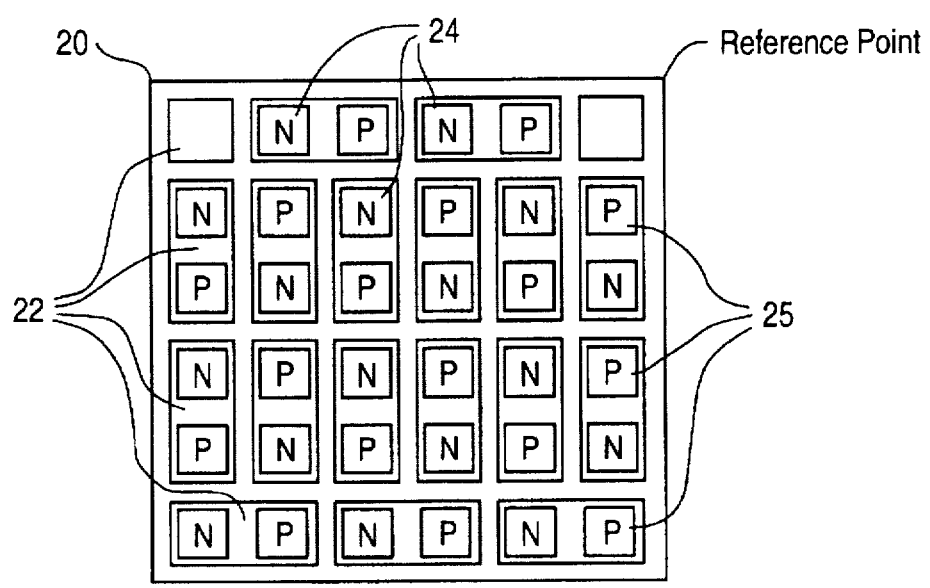
FIG. 2A is a bottom assembly of a TEM in the prior art.
Figure 2B:
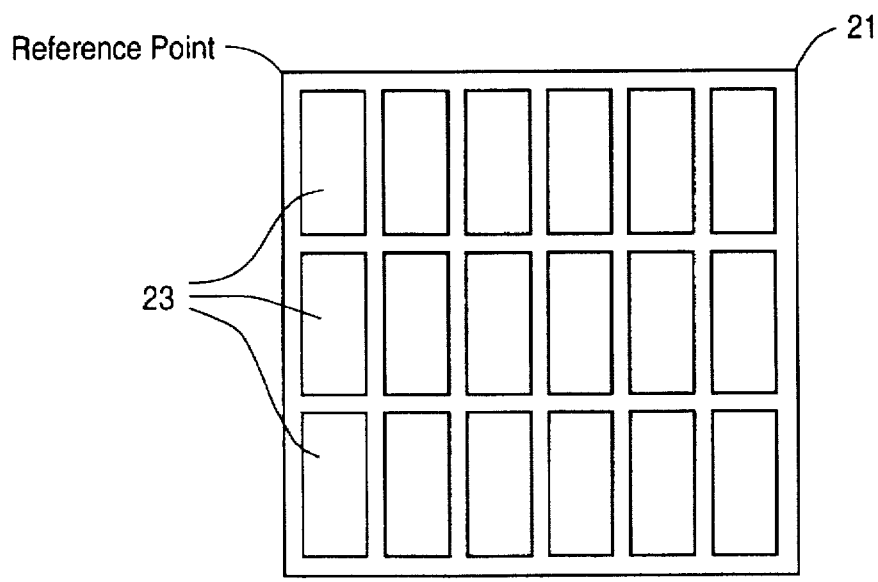
FIG. 2B is the top assembly of the TEM in FIG. 2A.

In a conventional TEM, electrically conductive patterns are first placed on ceramic substrates, as shown in FIGS. 2A and 2B, which respectively illustrate top and bottom assemblies of a partially completed TEM. In FIG. 2A the substrate 20 has a pattern 22. FIG. 2B more clearly illustrates the pattern 23 on the substrate 21. Ceramic alumina roughly 0.025 inch thick is commonly used for the substrates 20 and 21, and the patterns 22 and 23 are printed copper on the substrates 20 and 21. The outer dimensions of the alumina substrates are dictated by the total cooling needed. The range in substrate length in one direction is from about 0.250 inch up to about 2 inches per side. The typical length is about 1 inch.

An array of thermoelectric elements 24 and 25 is placed onto a sheet of solder (not shown) which covers one of the conductive patterns, shown as the pattern 22 on the bottom substrate 20. The elements 24 and 25 are formed from semiconducting crystal ingots, each several inches in diameter and 2–3 feet long. Each cylindrically-shaped ingot is doped with an impurity with a resulting excess of electrons (N-type material) or deficiency of electrons (P-type material). The ingots are then cut into disks and then into cube-shaped P-type elements 25 and N-type elements 24, roughly 0.100 inch on a side. These elements are positioned by highly trained technicians with the aid of tweezers and a microscope, one at a time, on the pattern 22.

This bottom assembly is heated in an oven or on a hot plate until the sheet melts, bonding the thermoelectric elements 24 and 25 to the pattern 22.

Finally, the top assembly of the substrate 21 and pattern 23, which is also covered with a sheet of solder, shown in FIG. 2B is positioned and aligned with the assembly shown in FIG. 2A. The top and bottom assemblies are reheated to bond the two assemblies together.

Figure 3:
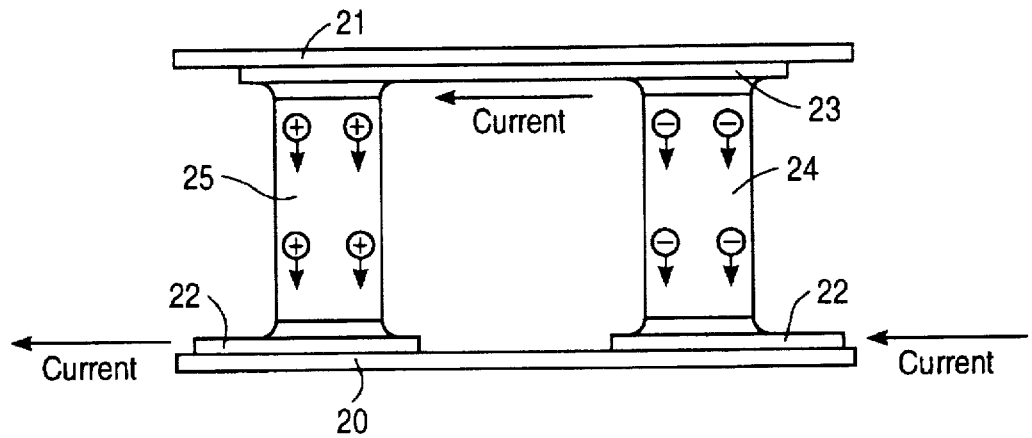
FIG. 3 is a cross-sectional view of part of combined assemblies of the TEM in FIGS. 2A and 2B.

A side view in FIG. 3, of part of the completed assembly, illustrates the operation of the TEM. The conductive pattern 22 on the bottom substrate 20 is attached to the bottoms of N-type unit 24 and P-type unit 25. The pattern 22 is such that the bottoms of two elements 24 and 25 are not connected. On the other hand, the conductive pattern 23 on the top substrate 21 connects the tops of the two neighboring elements 24 and 25. In operation, a current is driven through the circuit formed by the assembly. As shown, the current enters the bottom of the N-type unit 24 and exits its top. The current then travels through the pattern 23 on the top substrate 21 to enter the top of the P-type unit 25 and exits its bottom to the next N-type unit connected to the conductive pattern 22. The complete assembly forms a single, series-type circuit of alternating P-type and N-type semiconducting elements 24 and 25, as represented in FIG. 1.

The majority electronic carriers (which are also the thermal carriers) in the elements 24 and 25 travel in the same direction so that thermal energy is transferred from one substrate to the other. In FIG. 3 thermal energy is transferred by the majority carriers from the substrate 21 to the substrate 20, i.e., substrate 21 is cooled and substrate 20 is heated. Heat is pumped from one side of the TEM to the other. Note that if the current is reversed, then direction of travel of the majority electronic carriers is reversed and the direction of the heat transfer is also reversed.

There are several major drawbacks to this labor-intensive method. A first drawback is that the individual handling of the very fragile thermoelectric elements 24 and 25 requires that they be sufficiently large to withstand being grasped and handled. This limits the number of individual elements that can be placed in a given area.

Another drawback is that the elements 24 and 25 must be spaced a sufficient distance from one another to ensure that the array is not disturbed as new elements 24 and 25 are added and positioned on the ceramic substrate 20. This further reduces the number of elements that can be placed within a given area and limits any assembly method that is based on the individual handling of elements.

Still another drawback is that the P-type material and the N-type material appear identical to each other. Hence, an element of the wrong type can be placed in a particular position. Since the carriers now travel in the wrong direction, heat flow for this element is in the wrong direction, lowering the total net heat flow of the module.

Manual handling places a practical limit of the number of the elements 24 and 25 which can be assembled. For practical reasons, the size of the substrates cannot be increased indefinitely. As the array of elements become larger, the chances of human error increases markedly. Thus there are presently no TEMs with a total number of elements greater than about 300.

Finally, manual handling of the elements also forces the thickness of each unit to be at least 0.040 inch. Typically the elements 24 and 25 are 0.080 inch or more thick. However, as the thickness of the elements increases, the coefficient of performance (COP), explained below, attains its maximum value at lower and lower cooling powers. Conversely, with a decrease in thickness, the cooling power at maximum COP improves until parasitic effects become significant.

The present invention overcomes these drawbacks. Within the same dimension of a TEM, the number of active thermoelectric elements is increased and the thickness of the elements is optimized. The result is a significantly improved TEM which can operate with cooling power greater than that of a conventional TEM, and at maximum COP.

As stated above, the present invention does not require the development of new thermoelectric materials. Rather, the present invention improves the performance of TEMs with existing materials.

In accordance with the present invention, the semiconducting crystal cylinders are formed in the same manner as described above. The cylinders are cut into disks 0.020 to 0.050 inches thick. A thickness of 0.030 inches appears to be optimum. With thicknesses less than 0.030 inches, undesirable parasitic heating effects begin to become significant.

The disks are then cut into bars, approximately 0.100 inch wide, and up to 2.0 inches long. This width is selected as a balance between the fragility of the semiconductor crystal and the desire to increase the number of elements. Lengths over 2 inches make handling difficult and performance of the material decreases.

Figure 5:
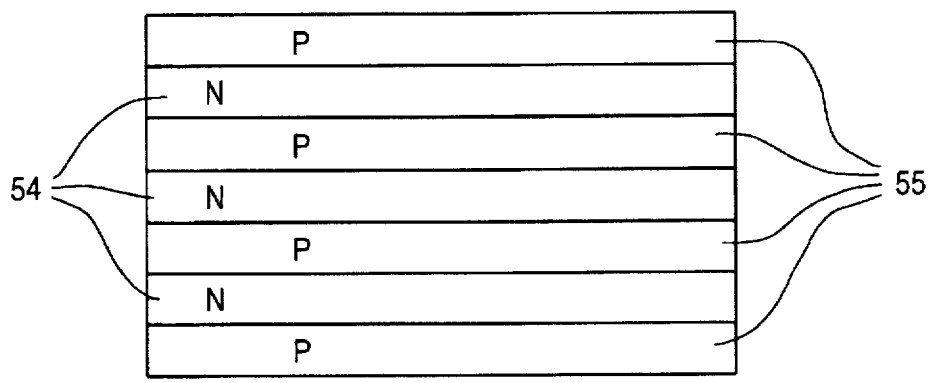
FIG. 5 is an arrangement of bars of thermoelectric material used in the manufacture of TEMs according to the present invention.
Figure 6A:
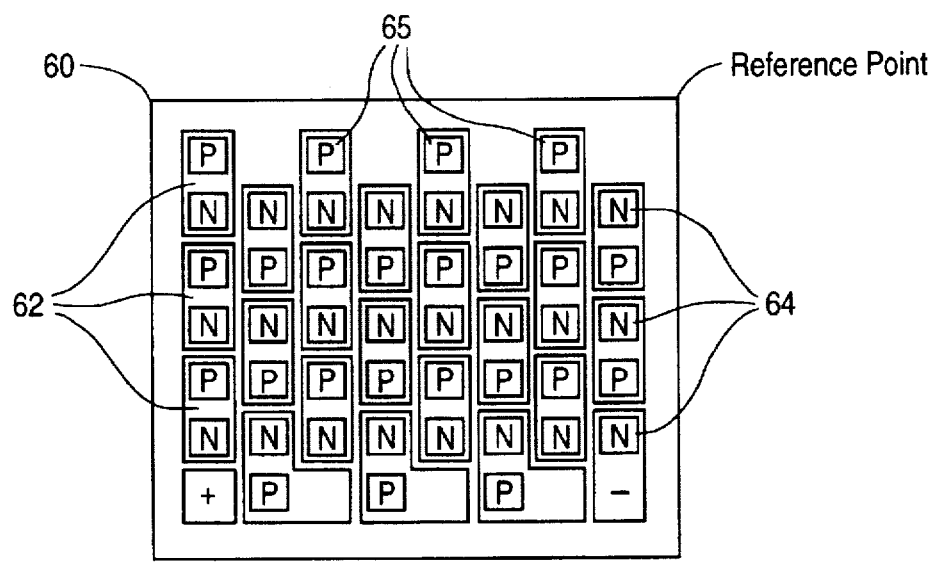
FIG. 6A is a bottom assembly of a TEM according to one embodiment of the present invention.

The semiconductor bars are then arranged, as shown in FIG. 5, in an alternating NPNP pattern on a ceramic substrate 60, which has an electrically conductive pattern 62, shown in FIG. 6A. The pattern 62 is covered with a solder sheet. FIGS. 9A–9E and 10A–10E and the accompanying text describe novel techniques for covering the electrically conductive patterns on ceramic substrates. These techniques contribute to the effectiveness of the TEM of the present invention.

After the solder in place over the electrically conductive patterns, the bars 54 and 55 are soldered into place by a hot plate or an oven. A slitting saw is first used to create a well-defined, narrow gap between the alternating bars. The bars are then separated in-situ into individual N-type elements 64 and P-type elements 65 respectively, by a slitting saw running perpendicular to the previous movements of the slitting saw. A similar technique is used to separate a semiconductor wafer into integrated circuits. Typically such saw blades are less than 0.010 inches wide. Besides a slitting saw, a cutting laser may also be used to separate the bars 54 and 55 from each other, and to separate the bars 54 and 55 into the elements 64 and 65. Electrical discharge machining can also be used to separate the bars with elements. The assembly of separated elements 64 and 65 are shown in FIG. 6A. At this point, it may be desirable to fill the gaps with an electrically and thermally insulating material.

Figure 6B:
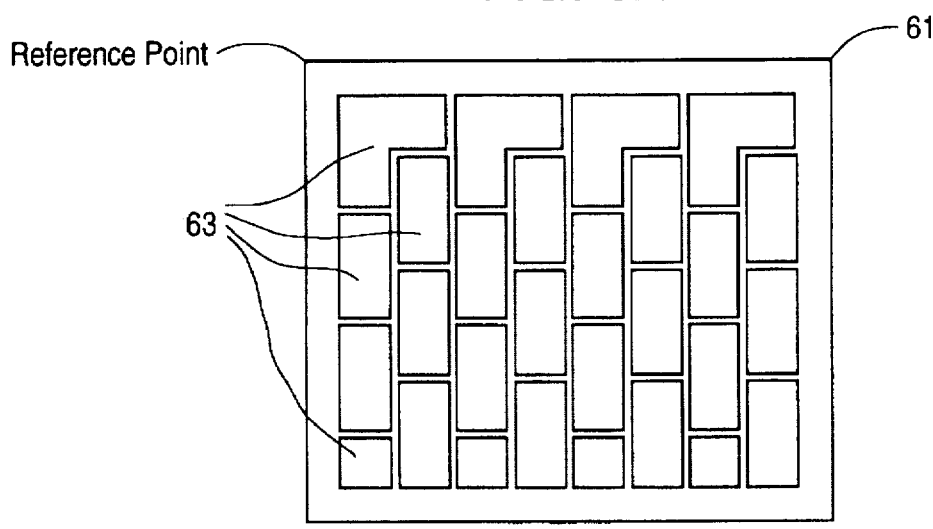
FIG. 6B is the top assembly of the TEM in FIG. 6A.

Then an upper ceramic substrate 61 with a electrically conductive pattern 63 complementary to the pattern 62, shown in FIG. 6B, is arranged and placed over the substrate 60 and elements 64 and 65. A sheet of solder over the pattern 63 is not shown. As described with respect to a conventional TEM, the substrates 60 and 61 are bonded together to form the completed TEM.

In the manufacturing process, the size of the bars and their close arrangement allow for greater automation. This reduces labor costs and associated errors induced when assembly is performed manually.

The TEM of the present invention has many advantages in performance. The use of a thin slitting saw greatly reduces the space between the thermoelectric elements 64 and 65. This raises the percentage of the ceramic substrates 60 and 61 which are covered by the elements 64 and 65. This percentage is related to the amount of area of a substrate which is devoted toward heat transfer. The greater the area the better the cooling performance. For small TEMs, this percentage is approximately 70%; for larger TEMs, this percentage can exceed 90%. Additionally, the thermoelectric elements are at the optimum operational thickness.

Operational parameters for a TEM include the input power, the amount of energy used to drive the TEM; the cooling power, the amount of energy transferred by the TEM in a unit of time; and the coefficient of performance (COP), the ratio of cooling power to input power. It should be noted that the term, "cooling power," is used because many of the applications contemplated are for refrigeration by the TEM. Since a TEM may used for heating purposes, the term, "heating power," could be also used.

Figure 4:
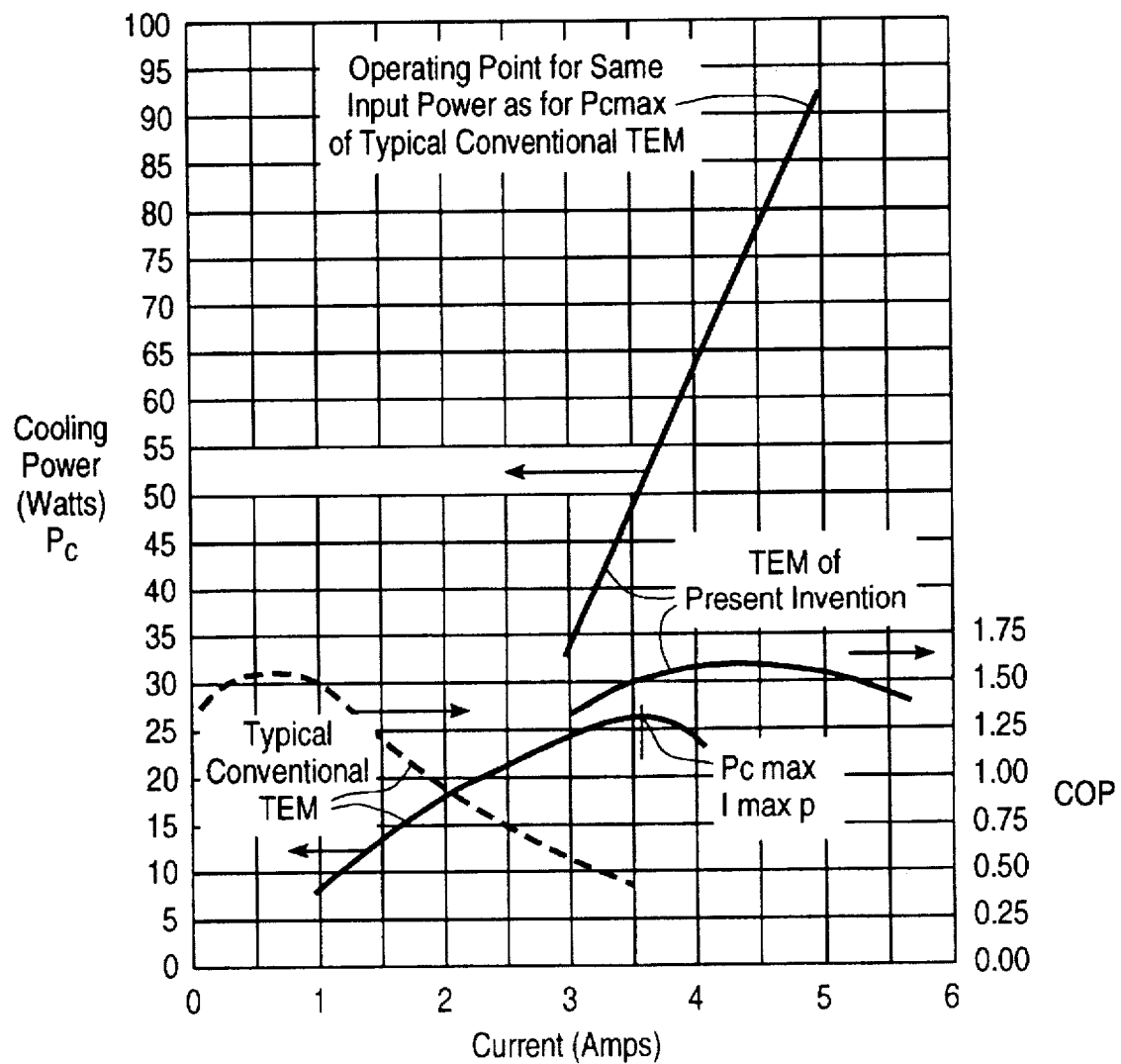
FIG. 4 is a combined representative graph which plots the current through a TEM versus its cooling power and the current versus the coefficient of performance. A prior art TEM and a TEM according to the present invention are illustrated in the graph of FIG. 4.

FIG. 4, which shows the relationships between the cooling power, $P_c$, and the coefficient of performance, COP, versus current, illustrates the performance of a typical present-day TEM. The data for the typical module is derived from a common, commercially available TEM. Note that the maximum cooling power, defined in FIG. 4 as $P_{cmax}$, occurs at a particular current, defined in FIG. 4 as $I_{maxp}$. Note also that the operating point for maximum cooling power is displaced laterally from the point of maximum coefficient of performance, i.e., maximum cooling is achieved at the expense of efficient power consumption.

The performance of a TEM according to the present invention having the same ceramic substrate dimensions is also shown in FIG. 4. For the same input power which produced the maximum cooling power in the present, conventional TEM, the cooling power in the inventive TEM has now been increased by over a factor of three, while occupying less volume.

This improved performance arises from the greater number of thermoelectric elements. For the present TEM, the individual elements occupy 73.5% of the TEM area, rather than the 31.1% in the typical TEM. Also, the thickness of the elements has been reduced. The result is to significantly increase cooling power at the operation point of maximum COP.

Quantitatively, the cooling power, the amount of energy transferred in a unit of time, of a TEM is shown by the following equation:

$$P_c = sIT_c - \tfrac{1}{2}RI^2C - (T_h - T_c)$$

Figure 7:
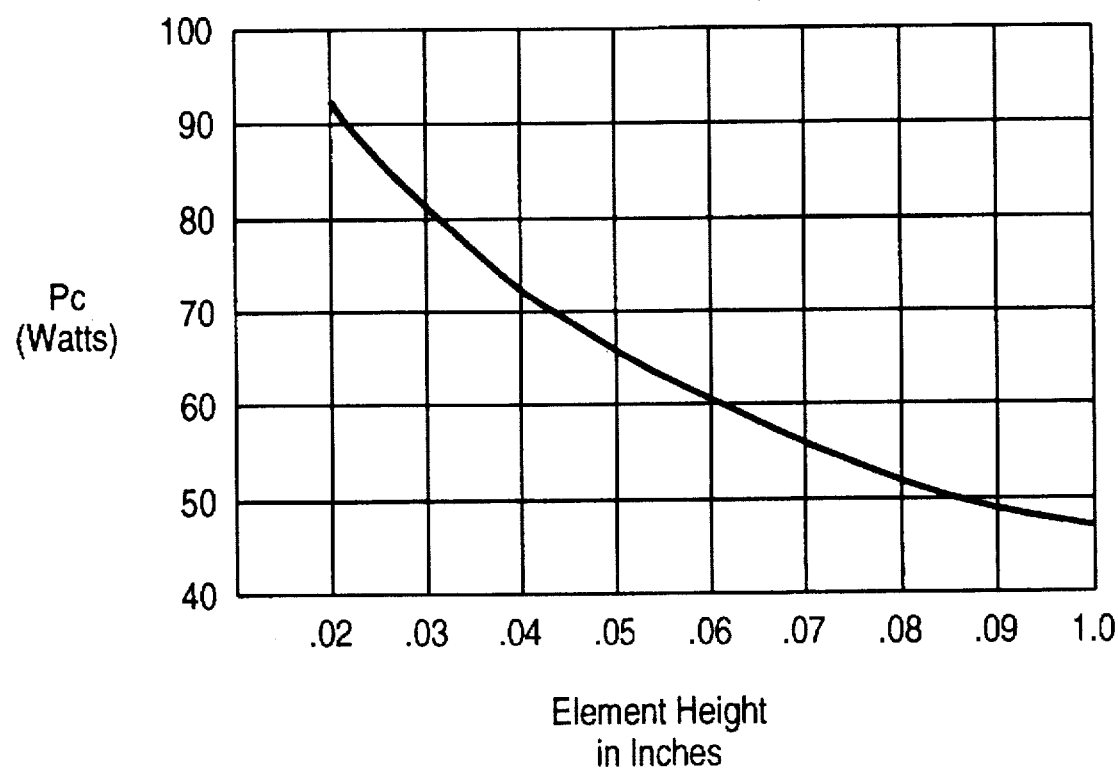
FIG. 7 is a graph of the cooling power versus the thickness of the thermoelectric materials in a TEM.

The equation further reduces to:

$$P_c = sIT_c - \tfrac{1}{2}(\rho h/w_1 w_2)nI^2 - (kw_1 w_2/h)n(T_h - T_c)$$

where $P_c$=heat absorbed at the cold side of the TEM s=Seebeck coefficient, a basic property of the TEM material I=current through the TEM $T_c$=temperature of the cold side of the TEM $T_h$=temperature of the hot side of the TEM R=electrical resistance of the TEM C=thermal conductance of TEM $\rho$=the resistivity of the TEM material h=the thickness of each thermoelectric element $w_1$=the length of the element in a first direction parallel to the substrates $w_2$=the length of the element in a second direction perpendicular to the first direction and parallel to the substrates k=the thermal conductivity of the TEM material n=total number of thermoelectric elements in the TEM Thus for the same current, I, $P_c$ is increased by increasing the number of elements, n, and decreasing the thickness of the elements, h, from the present norm of 0.080 inches. In fact, the h has been reduced to 0.020 inch, the optimum thickness in view of increased parasitic effects due to smaller thicknesses. FIG. 7 plots $P_c$ as a function of element thickness for a constant input power.

Note that in the TEM illustrated by the partial lower assembly in FIG. 6A, the top and bottom rows of the P-type elements 65 have alternating empty spaces in the array. This allows the TEM to be manufactured according to the present invention. Nonetheless, these spaces reduce the active area used for heat transfer.

Figure 8A:
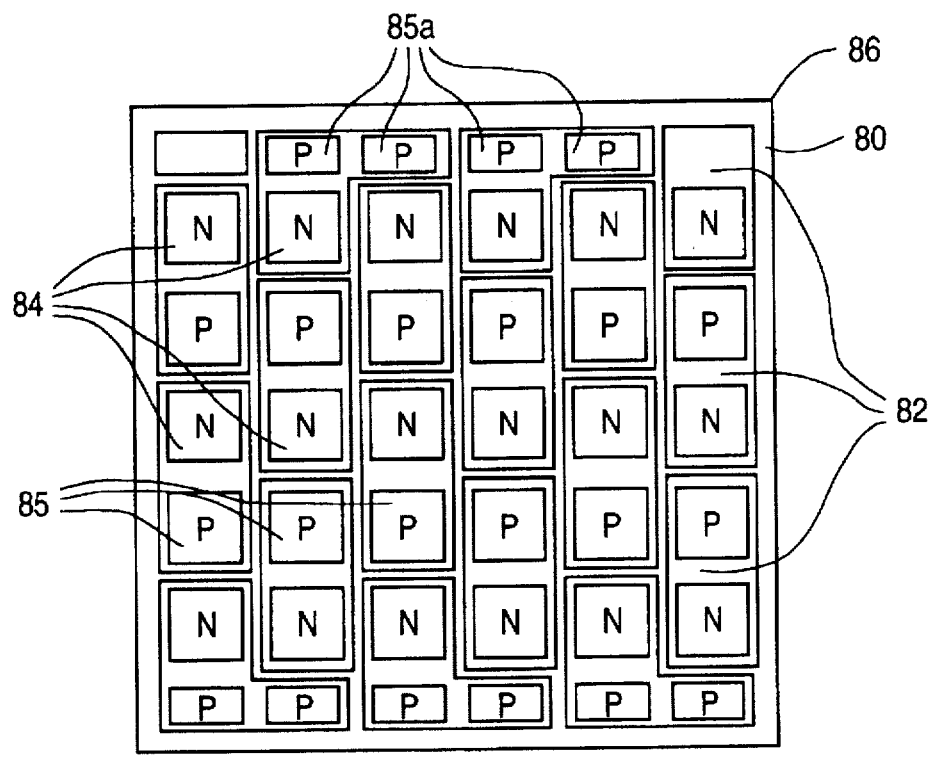
FIG. 8A is a bottom assembly of a TEM according to another embodiment of the present invention.
Figure 8B:
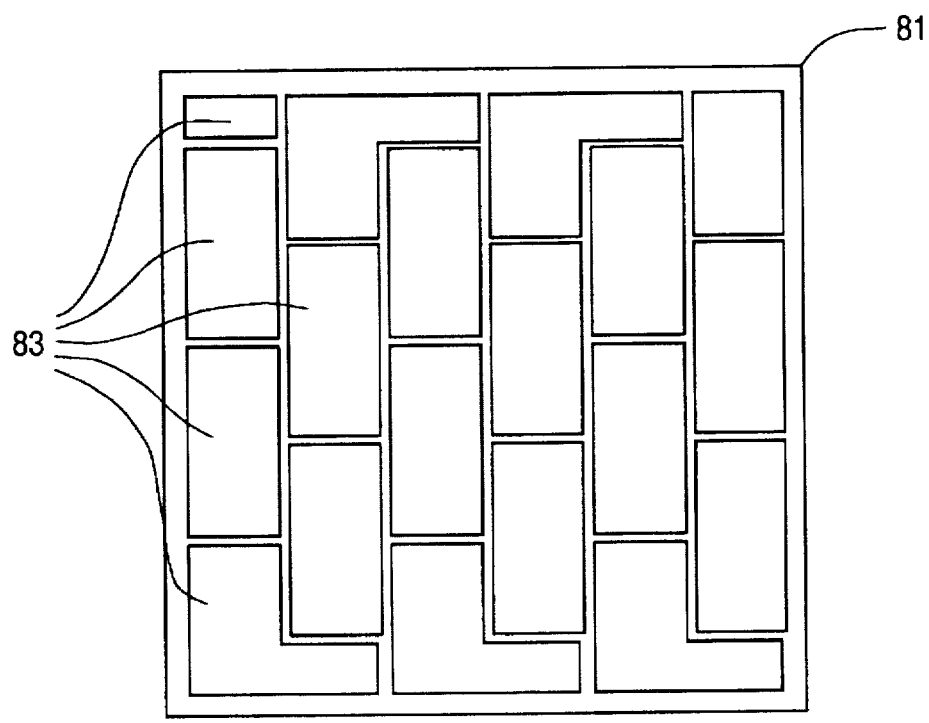
FIG. 8B is the top assembly of the TEM in FIG. 8A.

An alternative embodiment of the present invention removes these spaces. A thermoelectric element can be split into two and still retain the same performance as the original, as long as the two halves are connected in parallel. As shown in FIG. 8A, P-type half-width elements 85A are placed at the top and bottom edges where the circuit reverses direction. In the manufacturing process, half-width bars are arranged at the top and bottom of the array of full-size bars 54 and 55. The half-width elements 85A are separated by a slitting saw with the other elements 64 and 65. Alternatively, full-width bars can be arranged at the top and bottom of the array of bars 54 and 55. The two full-width bars can be separated into half-width bars in the separating steps.

Of course, the patterns 82 and 83 are respective modifications of the patterns 62 and 63. The modified patterns 82 and 83 also connect the half-width elements 85A, besides the same connections as represented in FIG. 1.

The present invention also provides for novel methods for covering the electrically conductive patterns over the ceramic substrates. Solder is used not only for attaching the semiconductor bars (and resulting thermoelectric elements), but also for forming part of the electrical circuit of the TEM to significantly contribute to the current capacity of the TEM.

Figure 9A:
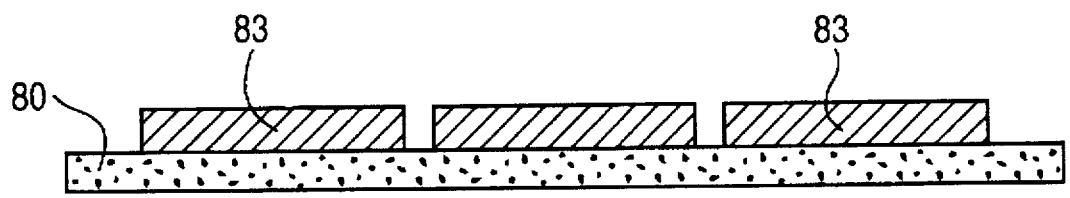
FIGS. 9A–9E illustrate the steps of covering the conductive pattern on the ceramic substrate of a TEM, according to one embodiment of the present invention.
Figure 9B:
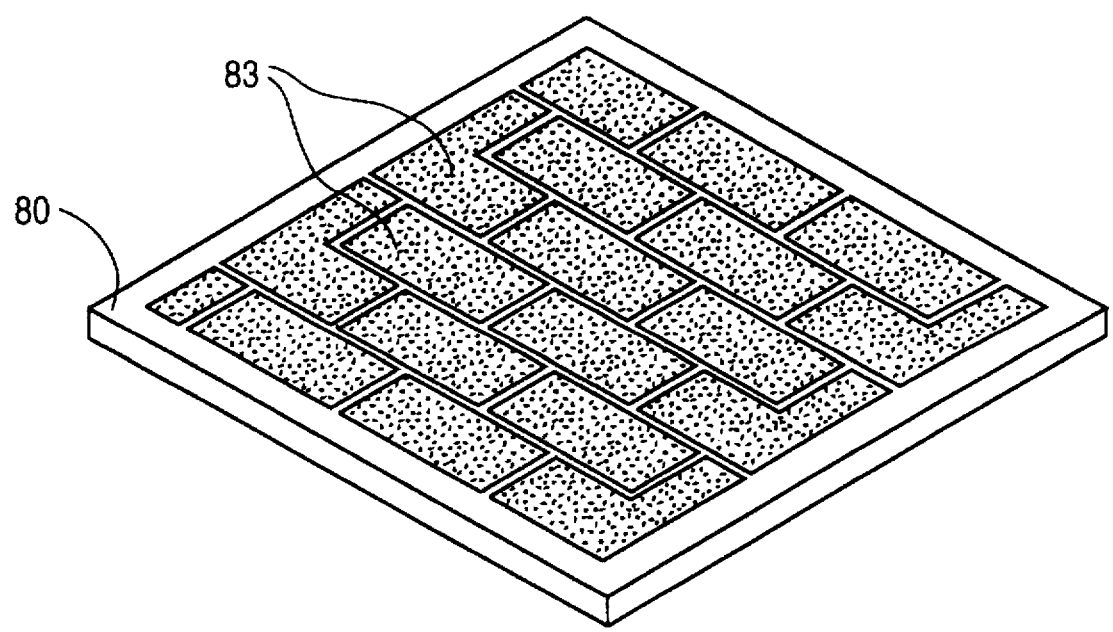
Figure 9C:
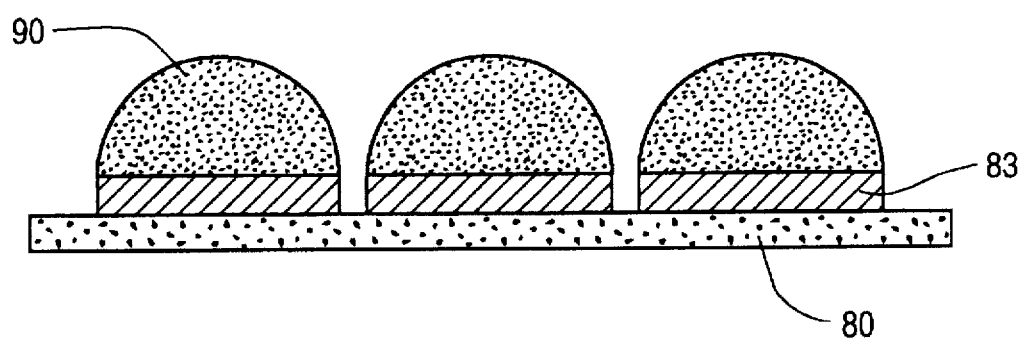
Figure 9D:
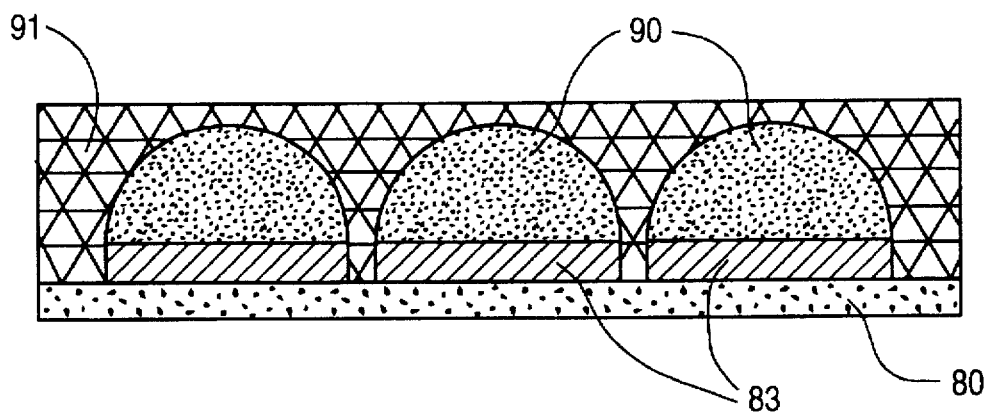
Figure 9E:
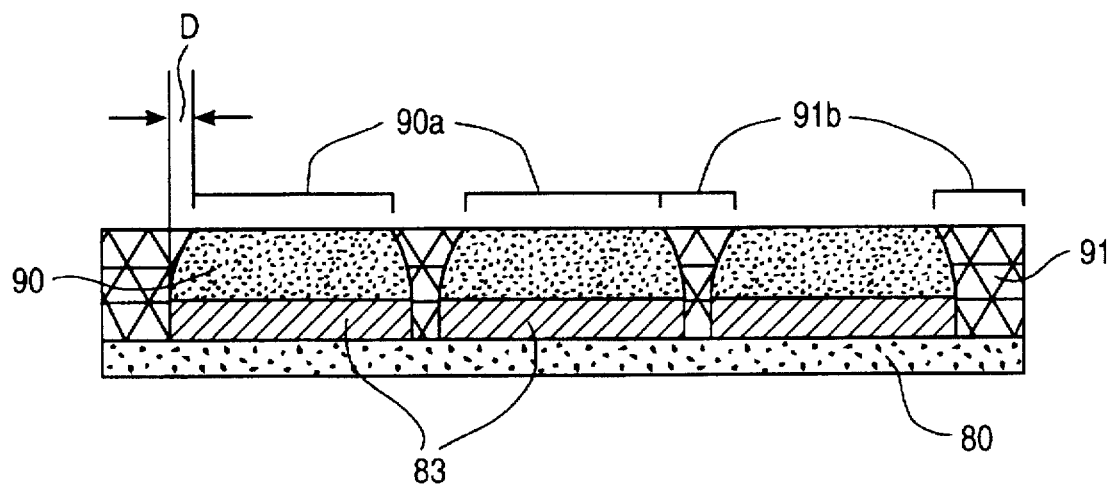

As shown in the cross-sectional view 9A and the perspective view 9B, the electrically conductive pattern 83 is created on the ceramic substrate 80. The pattern 83 is not only electrically conductive, but is also thermally conductive. A minimal thickness for the pattern is desirable and typically copper in a thickness of 0.5 mils can be used for the pattern 83 by standard, commercially available processes. Solder 90 is then applied over the pattern 83 by a wave solder process. As shown in FIG. 9C, the solder forms rounded surfaces on the patterns 83 due to surface tension. After the solder is cooled, a coating of electrically, insulating paste material 91 is applied over the entire surface of the substrate 80, pattern 83 and solder 90. The paste material 91 also has a high melting temperature. Paste materials, such as H77T, from Epoxy Technologies Company of Bellerica, Mass., has been found suitable. The paste 91 is allowed to harden as shown in FIG. 9D. Then the top portions of the hardened paste material 91 and the solder 90 are sanded off. A flat surface covered with abrasives, such as ordinary Wet-or-Dry paper from the 3M Corporation of Minneapolis, Minn. is suitable for the sanding operation. Alternatively, a rotating drum with an abrasive surface can be passed over at a fixed height. A flat surface is formed by the top surfaces of the epoxy 91A and the top surfaces 90A of the solder. The semiconductor bars are then placed on the flattened solder 90 and heated to fix the bars in place.

This method results in insulation, the paste material 91, between the solder 90 and a surface 90A which supports the P and N-type semiconductor bars at a fixed and predetermined height above the ceramic substrate 80. In the described embodiment the solder 90 is 0.008 to 0.020 inches thick after the semiconductor bars are soldered into place, depending upon the power required by the application. The circuit, primarily the cross-section of the solder, as seen in the drawings, remains a fixed geometry and the amount of current which can be carried in the circuit of the serially-connected semiconductor elements (see FIG. 1) high. A disadvantage of this method is that the resulting surface 90A of the solder to which the semiconductor bars are attached is smaller than the electrically conductive pattern 83 on the substrate. The resulting shrinkage at the surface is shown by capital letter D and illustrates the shrinkage along one edge of the electrically conductive pattern 83. This adversely affects the current capacity of the circuit.

Figure 10A:
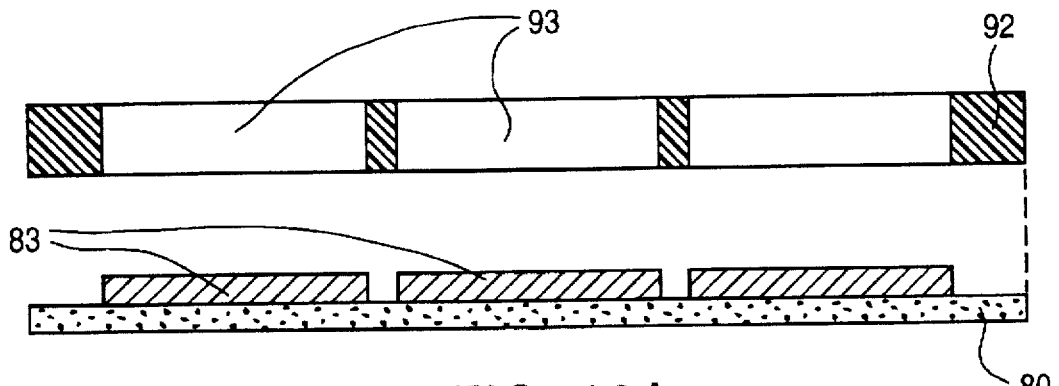
FIGS. 10A–10E illustrate alternative steps of covering the conductive pattern on the ceramic substrate of a TEM, according to another embodiment of the present invention.
Figure 10B:
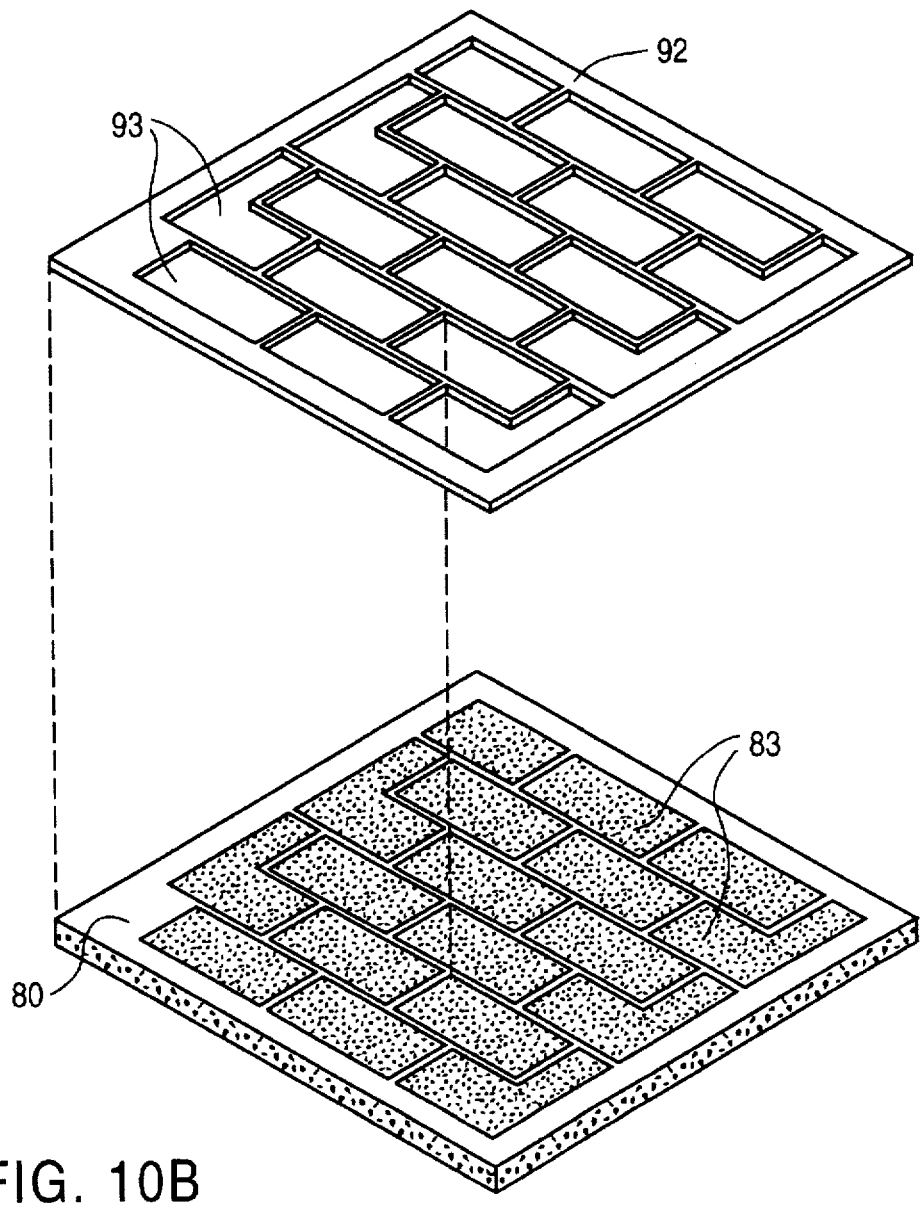
Figure 10C:
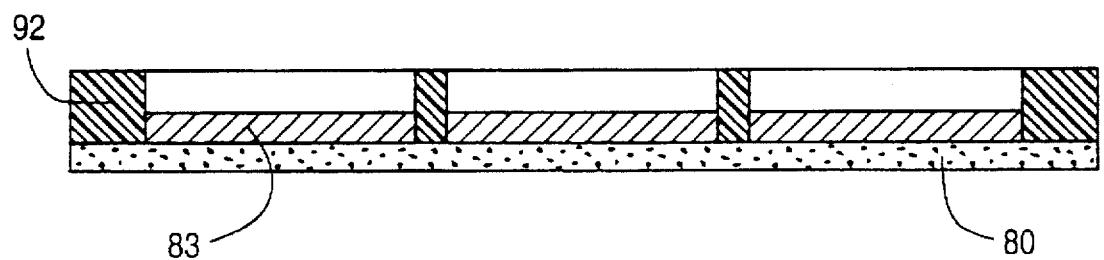
Figure 10D:
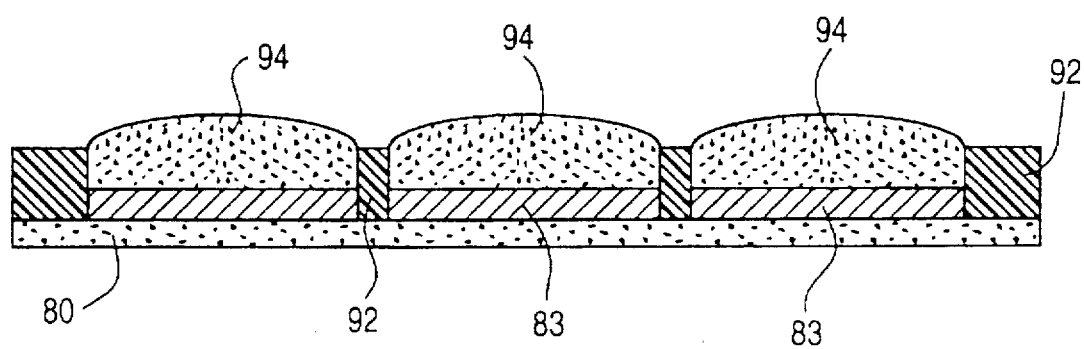
Figure 10E:
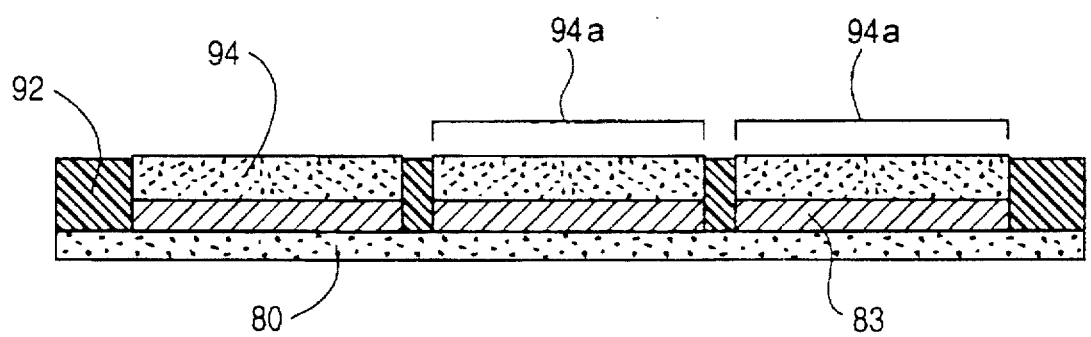

Alternatively, after the electrically conductive pattern 83 is created on the ceramic substrate 80, an electrically insulating mask layer 92 having apertures 93 matching the electrically conductive pattern 83 is fixed to the substrate 80. A useful mask for the layer 92 is an electrically insulating material which has a high degradation temperature with a low thermal conductance. Any number of polymers capable of withstanding 200° C. are acceptable, one example being Mylar™. A sheet of mask material is first bonded to a sheet of adhesive, which is available from several commercial sources. Then the aperture patterns are cut by a laser and the resulting mask layer 92 is attached to the substrate 80 with the sheet of adhesive. As shown in the cross-sectional view in FIG. 10A and the perspective view in FIG. 10B, the apertures 93 leave the top surfaces of the electrically conductive pattern 83 exposed. This is shown in FIG. 10C. By a wave-solder process, solder 94 is then applied to the thermally conducted pattern 83, as illustrated in FIG. 10D. After the solder 94 cools, the top portions of the solder 94 are sanded to flat surfaces 94A by a horizontal sanding operation discussed previously. As shown in 10E, the solder which extends above the mask layer 92, in the present example is removed. The solder 94 is sanded to within 6 mils of flush with the top of the mask layer 92.

N through P and N-type semiconductor bars are placed on the solder 94. The solder 94 is then heated. If the tops of the sanded solder 94 is sufficiently close to the top of the mask layer 92, the weight of the semiconductor bars can cause the bars to sink and rest upon the mask layer 92 as the solder 94 melts. The P and N-type semiconductor bars are supported at a fixed and a predetermined height above the ceramic by the mask layer 92. The current capacity of the resulting thermoelectric module is set and sufficient solder is ensured to contact the semiconductor bars.

The thickness of the mask layer 92 is adjusted to accommodate the final thickness of the solder 94. As mentioned previously, the solder can range from 0.008 to 0.020 inches thick, depending upon the power required by the application. The electrical circuit, primarily the cross-section of the solder, remains a fixed geometry for a high current capacity of the circuit. This technique has the advantage that the solder 94 achieves the required thickness without a decrease in cross-section. The solder is removed above the top of the mask material 92 to insure contact between the solder and the semiconductor bars. Finally, the solder 94 is more easily controlled. The mask material 92 prevents the excess solder of one pad from contacting the solder in an adjacent pad.

Of course, it should be noted that the novel methods discussed above for covering the electrically conductive patterns on the ceramic substrates have utility with the prior art method of manufacturing TEMs manually. The present invention allows the manually placed semiconductor elements to be set at a predetermined height above the ceramic substrates. The thickness of the solder can be adjusted for the desired current of the completed TEM. While the above is a complete description of the preferred embodiments of the present invention, various alternative, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A method of manufacturing an improved thermoelectric module, comprising defining a first electrically conductive pattern on a first substrate;

defining a second electrically conductive pattern on a second substrate;

placing alternate and parallel bars of first thermoelectric material and second thermoelectric material in close proximity to each other;

connecting said bars to said first conductive pattern;

separating said bars into elements;

placing said second substrate over said elements;

connecting said elements to said second conductive pattern;

whereby an improved thermoelectric module with an increased number of elements is formed.

2. The improved thermoelectric module manufacturing method of claim 1 wherein said separating step comprises sawing said bars into said elements.

3. The improved thermoelectric module manufacturing method of claim 1 wherein said separating step comprises electric discharge machining said bars into said elements.

4. The improved thermoelectric module manufacturing method of claim 1 wherein said separating step comprises slicing said bars into said elements with a laser.

5. The improved thermoelectric module manufacturing method of claim 1 comprising defining said bars with a thickness in the range of 0.020 to 0.050 inches.

6. The improved thermoelectric module manufacturing method of claim 5 wherein said bar defining step comprises defining said bars with a thickness of approximately 0.030 inch.

7. The improved thermoelectric module manufacturing method of claim 1 wherein in said placing step, bars are placed at the top and bottom of said alternate and parallel bars, said top and bottom bars having a width approximately one-half that of the remaining bars.

8. The improved thermoelectric module manufacturing method of claim 1 wherein said separating step further comprises separating bars placed at the top and bottom of said alternate and parallel bars into half-widths.

9. A method of manufacturing an improved thermoelectric module, comprising defining electrically conductive patterns on first and second substrates;

applying solder over said electrically conductive patterns;

applying a paste material over said first and second substrates, and over and between each electrically conductive pattern and said solder;

hardening said paste material;

removing portions of said paste material and said solder to form flat surfaces over said first and second substrates, said solder forming a pattern defined by said electrically conductive patterns at said flat surfaces;

placing alternate and parallel bars of first thermoelectric material and second thermoelectric material in close proximity to each other;

soldering said bars to said solder at a surface over said first substrate;

separating said bars into elements;

soldering said elements to said solder at a surface over said second substrate;

whereby an improved thermoelectric module with an increased number of elements is formed.

10. The manufacturing method of claim 9 herein said paste material comprises an electrically insulating material having a high melting temperature.

11. The manufacturing method of claim 9 herein said portion removing step comprises sanding said paste material and said solder.

12. The manufacturing method of claim 9 wherein solder applying step comprises wave-soldering said solder onto said conductive patterns.

13. The manufacturing method of claim 9 wherein said separating step comprises sawing said bars into said elements.

14. The manufacturing method of claim 9 wherein said separating step comprises electric discharge machining said bars into said elements.

15. The manufacturing method of claim 9 wherein said separating step comprises slicing said bars into said elements with a laser.

16. The manufacturing method of claim 9 comprising defining said bars with a thickness in the range of 0.020 to 0.050 inches.

17. The manufacturing method of claim 16 wherein said bar defining step comprises defining said bars with a thickness of approximately 0.030 inch.

18. The manufacturing method of claim 9 wherein in said placing step, bars are placed at the top and bottom of said alternate and parallel bars, said top and bottom bars having a width approximately one-half that of the remaining bars.

19. The manufacturing method of claim 9 wherein said separating step further comprises separating bars placed at the top and bottom of said alternate and parallel bars into half-widths.

20. A method of manufacturing an improved thermoelectric module, comprising defining electrically conductive patterns on first and second substrates;

creating apertures in first and second layers of masking material, said apertures in said first masking material layer matching said electrically conductive pattern on said first substrate, said apertures in said second masking material layer matching said electrically conductive pattern on said second substrate;

fixing said first mask material layer to said first substrate to expose said electrically conductive pattern on first substrate and said second mask material layer to said second substrate to expose said electrically conductive pattern on second substrate;

applying solder over said electrically conductive patterns;

removing portions of said solder to form flat solder surfaces over said first and second substrates in patterns defined by said electrically conductive patterns on said first and second substrates;

placing alternate and parallel bars of first thermoelectric material and second thermoelectric material in close proximity to each other;

soldering said bars to said flat solder surfaces over said first substrate;

separating said bars into elements;

soldering said elements to said flat solder surfaces over said second substrate;

whereby an improved thermoelectric module with an increased number of elements is formed.

21. The manufacturing method of claim 20 wherein said masking material comprises an electrically insulating material having a high melting temperature.

22. The manufacturing method of claim 21 wherein said masking material comprises a polymer.

23. The manufacturing method of claim 22 wherein said masking material comprises mylar.

24. The manufacturing method of claim 20 wherein said solder removing step comprises removing solder extending above said masking material layers on said first and second substrates.

25. The manufacturing method of claim 24 wherein said solder removing step comprises removing said solder to a predetermined height above said masking material layers.

26. The manufacturing method of claim 25 wherein said solder removing step comprises sanding said solder.

27. The manufacturing method of claim 20 wherein solder applying step comprises wave-soldering said solder onto said conductive patterns.

28. The manufacturing method of claim 20 wherein said separating step comprises sawing said bars into said elements.

29. The manufacturing method of claim 20 wherein said separating step comprises electric discharge machining said bars into said elements.

30. The manufacturing method of claim 20 wherein said separating step comprises slicing said bars into said elements with a laser.

31. The manufacturing method of claim 20 comprising defining said bars with a thickness in the range of 0.020 to 0.050 inches.

32. The manufacturing method of claim 31 wherein said bar defining step comprises defining said bars with a thickness of approximately 0.030 inch.

33. The manufacturing method of claim 20 wherein in said placing step, bars are placed at the top and bottom of said alternate and parallel bars, said top and bottom bars having a width approximately one-half that of the remaining bars.

34. The manufacturing method of claim 20 wherein said separating step further comprises separating bars placed at the top and bottom of said alternate and parallel bars into half-widths.

35. A improved method of manufacturing a thermoelectric module, comprising defining electrically conductive patterns on first and second substrates;

applying solder over said electrically conductive patterns;

applying a paste material over said first and second substrates, and over and between each electrically conductive pattern and said solder;

hardening said paste material;

removing portions of said paste material and said solder to form flat surfaces over said first and second substrates, said solder forming a pattern defined by said electrically conductive patterns at said flat surfaces;

placing first thermoelectric material elements and second thermoelectric material elements in close proximity to each other;

soldering said elements to said solder at a surface over said first substrate; and soldering said elements to said solder at a surface over said second substrate.

36. The manufacturing method of claim 35 wherein said paste material comprises an electrically insulating material having a high melting temperature.

37. The manufacturing method of claim 35 wherein said portion removing step comprises sanding said paste material and said solder.

38. The manufacturing method of claim 35 wherein solder applying step comprises wave-soldering said solder onto said conductive patterns.

39. A improved method of manufacturing an improved thermoelectric module, comprising defining electrically conductive patterns on first and second substrates;

creating apertures in first and second layers of masking material, said apertures in said first masking material layer matching said electrically conductive pattern on said first substrate, said apertures in said second masking material layer matching said electrically conductive pattern on said second substrate;

fixing said first mask material layer to said first substrate to expose said electrically conductive pattern on first substrate and said second mask material layer to said second substrate to expose said electrically conductive pattern on second substrate;

applying solder over said electrically conductive patterns;

removing portions of said solder to form flat solder surfaces over said first and second substrates in patterns defined by said electrically conductive patterns on said first and second substrates;

placing first thermoelectric material elements and second thermoelectric material elements in close proximity to each other;

soldering said elements to said flat solder surfaces over said first substrate; and soldering said elements to said flat solder surfaces over said second substrate.

40. The manufacturing method of claim 39 wherein said masking material comprises an electrically insulating material having a high melting temperature.

41. The manufacturing method of claim 40 wherein said masking material comprises a polymer.

42. The manufacturing method of claim 41 wherein said masking material comprises mylar.

43. The manufacturing method of claim 39 wherein said solder removing step comprises removing solder extending above said masking material layers on said first and second substrates.

44. The manufacturing method of claim 43 wherein said solder removing step comprises removing said solder to a predetermined height above said masking material layers.

45. The manufacturing method of claim 44 wherein said solder removing step comprises sanding said solder.

46. The manufacturing method of claim 39 wherein solder applying step comprises wave-soldering said solder onto said conductive patterns.

* * * * *